United States Patent [19]
DeSisto et al.

[11] Patent Number: 5,652,431
[45] Date of Patent: Jul. 29, 1997

[54] IN-SITU MONITORING AND FEEDBACK CONTROL OF METALORGANIC PRECURSOR DELIVERY

[75] Inventors: William J. DeSisto; Brian J. Rappoli, both of Alexandria, Va.

[73] Assignee: The United States of America as represented by the Secretary of the Navy, Washington, D.C.

[21] Appl. No.: 540,378

[22] Filed: Oct. 6, 1995

[51] Int. Cl.$^6$ .................................................. H01L 21/20
[52] U.S. Cl. ............................................. 250/373; 117/86
[58] Field of Search .......................... 250/373; 117/86, 117/85

[56] References Cited

U.S. PATENT DOCUMENTS

| 4,601,582 | 7/1986 | Casey, Jr. | 356/414 |
| 5,070,246 | 12/1991 | Durham et al. | 250/373 |

FOREIGN PATENT DOCUMENTS

| 62-285415 | 12/1987 | Japan | 117/86 |

OTHER PUBLICATIONS

Hebnel et al., "In Situ Measurement of the Metalorganic and Hydride Partial Pressres in a MOCVD Reactor Using Ultra-violet Absorbtion Spectroscopy", *J. of Cry. Growth*, vol. 98, pp. 293–301, 1989 no month.

*Primary Examiner*—Constantine Hannaher
*Attorney, Agent, or Firm*—Thomas E. McDonnell; Charles J. Stockstill

[57] ABSTRACT

The in-situ monitoring of metalorganic precursor delivery in a metalorganic chemical vapor deposition oxide system in high temperature super conductors (HTSC) film growth is accomplished by utilizing the distinct absorbance bands for metalorganic compounds. As an ultraviolet-visible light beam is passed through an effluent metalorganic gas stream the relative change in ultraviolet-visible absorbance of the ultraviolet-visible light beam passing through the effluent metalorganic gas stream is monitored. Stoichiometry control is achieved by feeding back absorbance data to a controlling parameter such as carrier gas mass flow rate, thus stabilizing fluctuations in source concentration in the bubble effluent from a computer or similar monitoring device. Such an apparatus and method improves the stoichiometry control of mixed metal oxide film deposition and increases the manufacturability of thin films.

15 Claims, 6 Drawing Sheets

5,652,431

IN-SITU MONITORING AND FEEDBACK CONTROL OF METALORGANIC PRECURSOR DELIVERY

BACKGROUND OF THE INVENTION

1. Field of the Invention

This invention pertains generally to a metalorganic chemical vapor deposition (MOCVD) and particularly to an apparatus and method for ultraviolet-visible in-situ monitoring and feedback control for a metalorganic precursor delivery used in MOCVD.

2. Description of the Related Art

Precise control of the relative partial pressures of metalorganics and hydrides is critical to the accurate and reproducible growth of epitaxial layers via metalorganic chemical vapor deposition (MOCVD). Strained-layered superlattices and narrow quantum well devices require accurate control over growth rate and layer doping to produce sharp, well defined boundaries between the component layers. Current MOCVD growth techniques employ calibration growth runs to determine reactant gas flow stabilization times and dwell times to flush the reactants and halt the growth process. Presently, metalorganic sources used in MOCVD of complex oxides are solids at room temperature and require elevated temperatures for sublimation. At these operating temperatures, volatility is unstable as a result of the chemical or physical changes in the original source material. For example, some compounds have been shown to thermally decompose upon heating or even oligomerize. As a result, reproducible film growth is difficult to achieve.

To provide data on the actual conditions within the growth chamber, several in-situ diagnostics techniques have been employed. One is the coherent antistokes Raman spectroscopy (CARS) which is used to monitor the partial pressure of $AsH_3$ in a flowing cell and allows the determination of $AsH_3$ concentration at a specific point in the reaction tube as a function of time. This technique, however, requires two high quality lasers and precise alignment, thereby reducing the cost effectiveness and utility for daily operation.

Another technique is infrared (IR) absorption spectroscopy of the metalorganics and hydrides utilizing an IR laser diode source with a multiple pass cell that can monitor partial pressures of the metalorganics and observe reaction products due to decomposition. However, the complexity of cell design, costliness of the measurement apparatus and perturbation of the growth environment preclude its widespread use.

Other methods have been utilized but they also have limitations. Some of these are flow studies using titanium oxide particles to characterize the flow conditions in the reaction chamber. However, the use of particles contaminates the growth system and requires an extensive cleaning prior to using reactant gases. Another, the ultraviolet detection method, is limited by the assuming of a constant molecular weight for the gaseous species. (Many of the precursors of interest form ologomers in the gas phase.) See, Hebner et al., In situ Measurement of the Metalorganic and Hydride Partial Pressures in a MOCVD Reactor Using Ultraviolet Absorption Spectroscopy, J. of Crystal Growth, Vol. 98, No. 3, pp. 293–301, 1989.

SUMMARY OF THE INVENTION

The object of this invention is to provide a reliable method and apparatus for controlling film stoichiometry in mixed metal oxides using ultraviolet-visible absorption spectroscopy.

This objective is accomplished through the use of in-situ ultraviolet-visible absorbance measurements of the effluent gas stream from a metalorganic bubbler. The relative changes in absorbance of the metalorganic source determine the concentration of metal organic compound in high temperature superconductor film growth. The stoichiometry control is achieved by feeding back the absorbance data to a controlling parameter, such as carrier gas flow rate, thus stabilizing fluctuations in source concentration in the bubbler effluent.

DESCRIPTION OF THE PREFERRED EMBODIMENTS

In this invention in-situ monitoring of ultraviolet-visible absorbance in the effluent gas stream from a metalorganic bubbler is made utilizing the distinct absorbance bands for metalorganic compounds. The metalorganic compounds used as precursors in high temperature superconductor (HTSC) film growth have very few absorbance bands (one in most cases) and extinction coefficients on the order of $10_4$ are observed. Correction of the relative changes in absorbance (concentration)—the log of the ratio of incident light in the absence of any species to the light in the presence of the species—of the metalorganic source are achieved by feeding back absorbance data of a controlling parameter, such as carrier gas mass flow rate, from a computer or similar monitoring device thus stabilizing fluctuations in source concentration in the bubble effluent.

Figure 1:
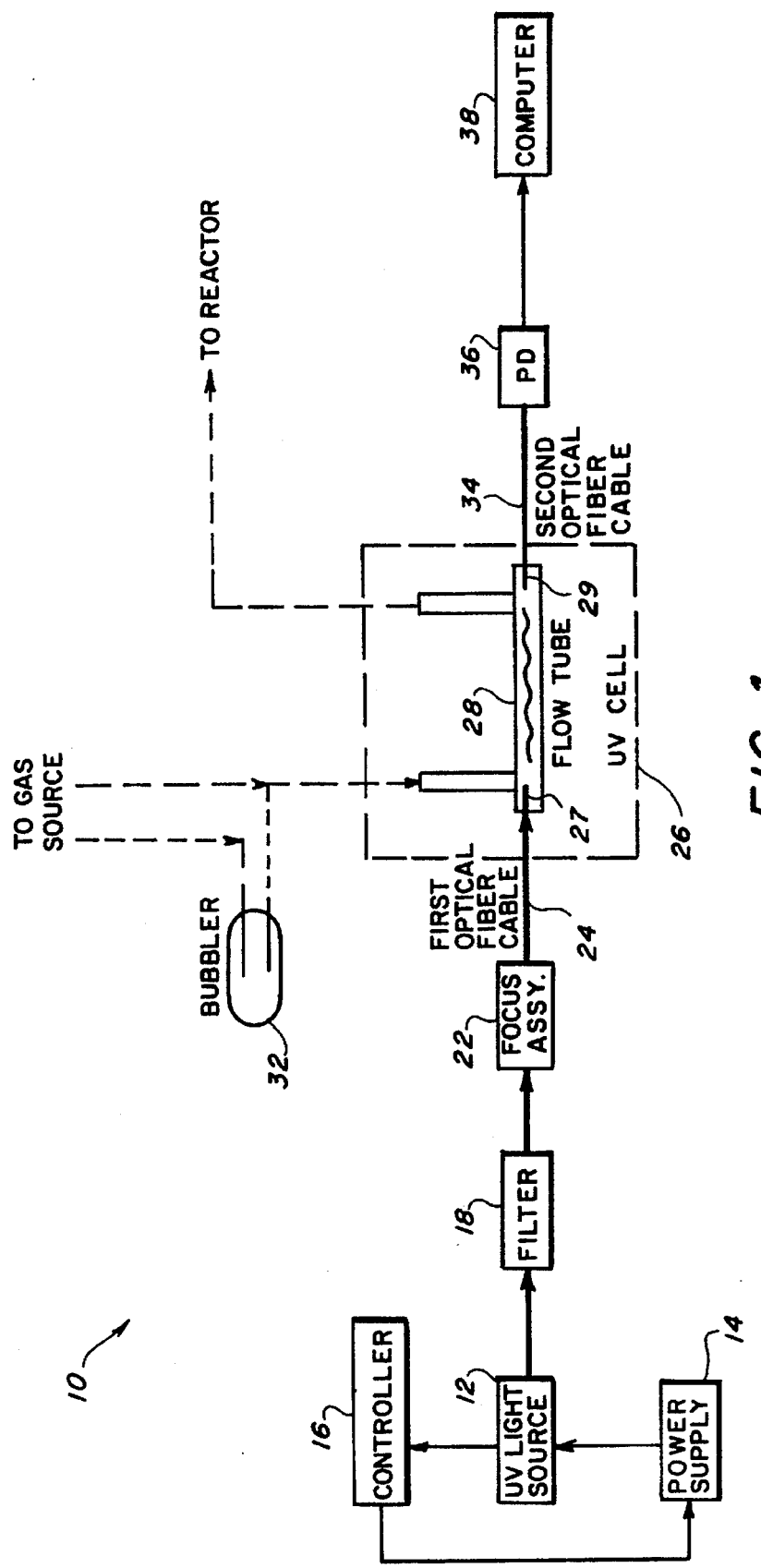
FIG. 1 shows a single wavelength in-situ monitor device for a metalorganic precursor delivery used in metalorganic chemical vapor deposition (MOCVD).

In a preferred embodiment, as shown in FIG. 1, an ultraviolet-visible (UV-Vis) light generated by a source 12 is part of a single wavelength in-situ monitoring system 10. Electrical power for the UV-Vis source 12 is provided by a power supply 14, either built-in or separate to the source 12, which provides controllable electrical power to the source 12 for varying the intensity of the UV-Vis light beam. The control is provided by intensity samples obtained by a photofeedback sensor head (not shown) that are applied to a controller 16. Optics (not shown) within the source 12 collimate the UV-Vis light beam that is filtered through a narrow band pass filter 18 centered on the absorbing wavelength and focused by fiber optic focusing assembly 22 onto a first fiber optic cable 24 for application to a UV-Vis cell 26. Upon being applied to the UV-Vis cell 26, the UV-Vis light beam travels through a long path flow tube 28 filled with a gas containing metalorganic particles from a bubbler 32. After the UV-Vis light beam passes through the cell 26, it is focused onto a second optical fiber 34 and applied to a photodetector 36. The photodetector 36 converts the incident light into an electrical signal which is processed by a computer 38 to obtain the absorption. Absorption in a wide bandwidth in the ultraviolet-visible spectrum is determined by the computer 38, utilizing a procedure well known to those skilled in the art, by comparing the absorption data obtained from the light passing through the flow tube 26 with the precursor present in the carrier gas to the absorption data obtained when the light passes through the flow tube 26 in the presence of the carrier gas alone.

The source 12 of UV-Vis light beam is, preferably, a stabilized deuterium lamp, such as a part no. 63163 manufactured by Oriel Corp. of Stratford, Conn., whose power source is, nominally, a power supply 14 providing a stable constant current, such as a part no. 68840, also manufactured by Oriel Corp. A power supply 14 output stabilization of 1% is achieved by measuring the UV-Vis light beam output from the source 12 and feeding this measured output value back through a feedback circuit controller 16 to the power supply 14. The controller 16 compares the output to the desired output and adjusts the current of the power supply 14, as required, to achieve the predetermined UV-Vis light beam output. The design of controller 16 is well known to those skilled in the art, however, a light intensity controller system such as part no. 68850 also manufactured by Oriel Corp. may be utilized.

The output UV-Vis light may be turned "on" and "off" by a shutter (not shown) to enable the operator to measure the output from the photodetector 36 in the absence of light, such as during a calibration process. The shutter (not shown) mechanically triggers horizontally to the UV-Vis light and totally attenuates the UV-Vis light and, when a measurement is desired, the shutter opens, allowing the UV-Vis light to pass through to the filter 18.

The filter 18 is a narrow bandwidth filter that tunes the UV-Vis light beam wavelength specifically to the wavelengths present in the absorption bands the operator desires to study. Any suitable filter may be utilized that will achieve this purpose. After passing through the filter 18, the filtered UV-Vis light beam is then focused by a fiber optic focusing assembly 22, such as part no. 77850 also manufactured by Oriel Corp., to define a narrow probe axis. The narrowly defined UV-Vis light beam is applied, through an interface connector (not shown), onto a first fiber optic cable 24, such as a UV-VIS part no. CN-1B, manufactured by UOP Guided Wave, Inc. of El Dorado, Calif., or any other type fiber optic cable suitable for the transmission of UV-Vis light without significant absorption. The cable 24 is terminated on the opposing end within a long path flow tube 28, such as part no. FT100 also manufactured by UOP Guided Wave, Inc., by an optical lens 27, such as part no. 1TG2S0-5B UV-VIS transmission probe also manufactured by UOP Guide Wave, Inc.

The UV-Vis cell 26, containing the long path flow tube 28, is used to measure the difference in the light beam passing through a UV-Vis cell 26 in the absence of a chemically absorbing species as related to the amount of light passing through the cell 26 in the presence of a chemically absorbing species. The long path flow tube 28 is normally constructed of a tubular stainless steel and operates at a reduced pressure of 5 to 20 Torr and have a leak rate less than $1 \times 10^{-8}$ cm$^3$ of air per second. An optical lens 29 is located at the opposing end of the flow tube 28 to collimate and focus the UV-Vis light beam onto a second, or exiting, optical fiber 34. This technique provides a minimum UV-Vis light loss during the sampling process.

A carrier gas, such as argon, is passed through a bubbler 32, such as part no. 65208 manufactured by Morton International, Inc. of Danvers, Mass., wherein a gas mixture, or reactant gas, containing the metalorganic compound is produced. The bubbler 32 gas mixture containing the metalorganic compound is applied to the long pathlength UV-Vis cell 28. The metalorganic compound is a solid having a vapor pressure over 0.05 Torr, which, when heated, forms a gas. Nominally, three types of metalorganic compounds are used, preferably, the yttrium (Y), copper (Cu), and barium (Ba). Yttrium and copper are nominally heated within the bubbler 32 to between 100°–130° C. and barium to between 200°–250° C. One important consideration for a metalorganic compound is that the chemical species must be chemically inert and able to withstand elevated temperature operations. This procedure must operate above the source temperature—the bubble temperature—of the material, otherwise the source material will suffer condensation. Also, a carrier gas other than argon, such as helium or nitrogen, may be utilized as long as the gas does not contain an absorption line that would conflict with the species of interest in the UV-Vis spectrum.

In operation, the flow tube 28 is filled with the reactant gas, however, prior to measurement, to obtain a proper baseline figure for absorption, the flow tube 28 should be evacuated and a baseline measurement made with only the carrier gas present. It should be noted that the use of a gas having a very weak absorption line in the UV-Vis spectrum is not totally prohibited because the determination of the ratios, described above, allows the subtraction out of very weak absorption lines that may interfere with the accuracy of the readings obtained.

The reactant gas flows from the long path flow tube 28 to a reactor or MOCVD growth chamber (not shown) having a suscepter (not shown) whereon it is deposited on a substrate to form a high temperature superconductor (HTSC) structure having a specific predetermined stoichiometry. The UV-Vis absorption of the metalorganics directly measures the concentration flowing into the reactor and allows the determination of the exact time dependence and steady state value of the gas concentration in situ and to modify it as required to control deposition. Measurement of the concentration of metalorganic compound in the reactant gas is done in the UV-Vis cell so that the various precursors can be measured and controlled separately. If such measurement were done in the reaction chamber, there would be significant overlap between the absorption bands in the UV-Vis and they could not be efficiently separated out.

Figure 2:
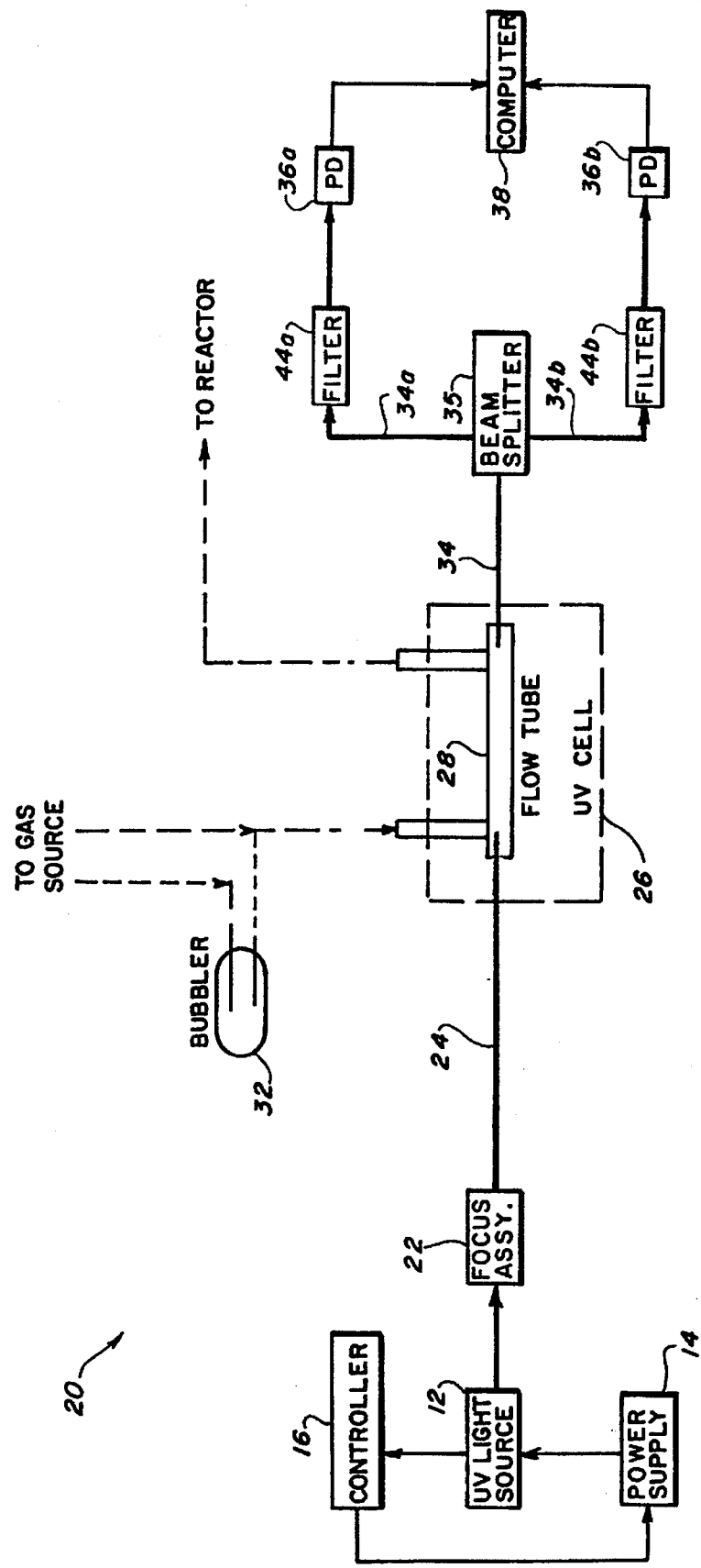
FIG. 2 shows a dual wavelength in-situ monitor device for a metalorganic precursor delivery used in metalorganic chemical vapor deposition (MOCVD).

In another preferred embodiment, FIG. 2, the in-situ monitoring system 20 provides for a dual wavelength measurement. The UV-Vis light beam exiting the flow tube 26 through the second fiber optic cable 34 is applied to a beam splitter 35, or a bifurcated fiber optic cable, which directs a portion of the UV-Vis light beam to each of two filters 44a and 44b. These filters 44a and 44b are narrow bandwidth filters tuned to the wavelengths present in the absorption bands the operator desires to study. Nominally, one filter 44a is configured for the measurement of the absorbing peak and the other filter 44b is configured for measuring the absorbance at a non-absorbing wavelength. The filtered UV-Vis light beams are then converted from a optical signal to an electrical signal by photodetectors 36a and 36b and applied to the computer 38 for analysis. The difference in absorbance levels gives an accurate measurement accounting for background changes due to changes in the system 20.

Figure 3:
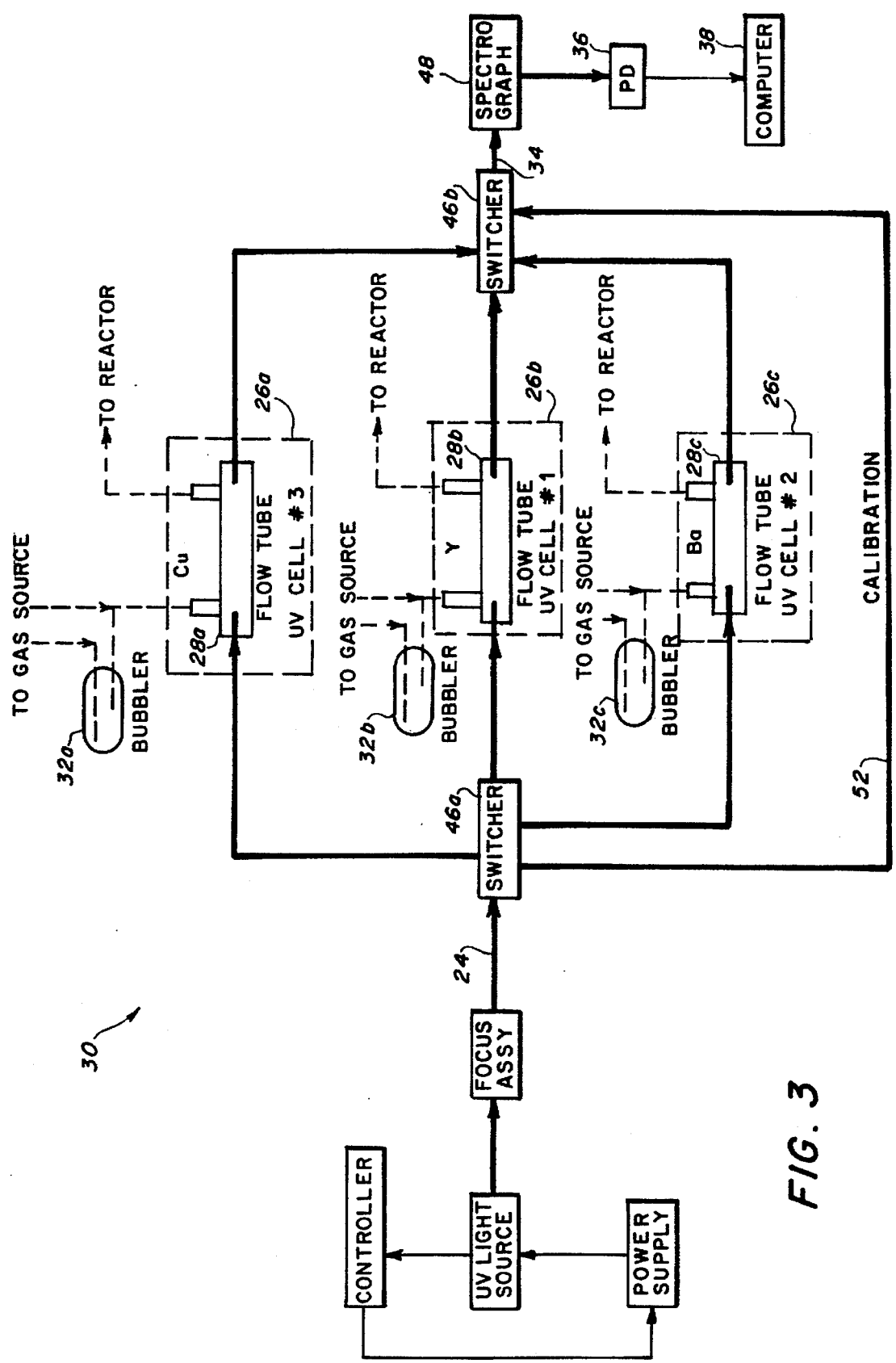
FIG. 3 shows a multi-wavelength in-situ monitor device for a metalorganic precursor delivery used in metalorganic chemical vapor deposition (MOCVD).

Another preferred embodiment, FIG. 3, provides an in-situ monitoring system 30 capable of multi-wavelength measurements. The absorbance of the three preferred metalorganic compounds are used and may be monitored sequentially. The UV-Vis light beam in the first optical fiber cable 24 is applied to a first fiber optic switcher 46a, such as a part no. 77626 also manufactured by Oriel Corp., which selectively switches the UV-Vis light beam between a plurality of UV-Vis cells 26a, 26b, and 26c (in this instance three) where the metalorganic/argon gas mixtures are present. The UV-Vis light beams exiting the plurality of UV-Vis cells 26a, 26b, and 26c are applied to a second fiber optic switcher 46b, operating in synchronization with the first fiber optic switcher 46a, selectively directing the attenuated UV-Vis light beams to a spectrograph 48. The spectrograph 48 passes the preselected wavelength of the attenuated UV-Vis light beam of interest to a photodiode array where the optical signal is converted to an electrical signal for analysis of the absorption data by a computer 38, as described above.

In this embodiment, a calibration optical circuit 52 applies an optical signal from the first optical switcher 46a directly to the second optical switcher 46b without passing through any UV-Vis cell 26a, 26b, or 26c. This optical circuit provides an unattenuated optical signal for evaluation by the computer 38 when determining the absorption of the UV-Vis light beam in the plurality of UV-Vis cells 26a, 26b, and 26c.

Figure 4:
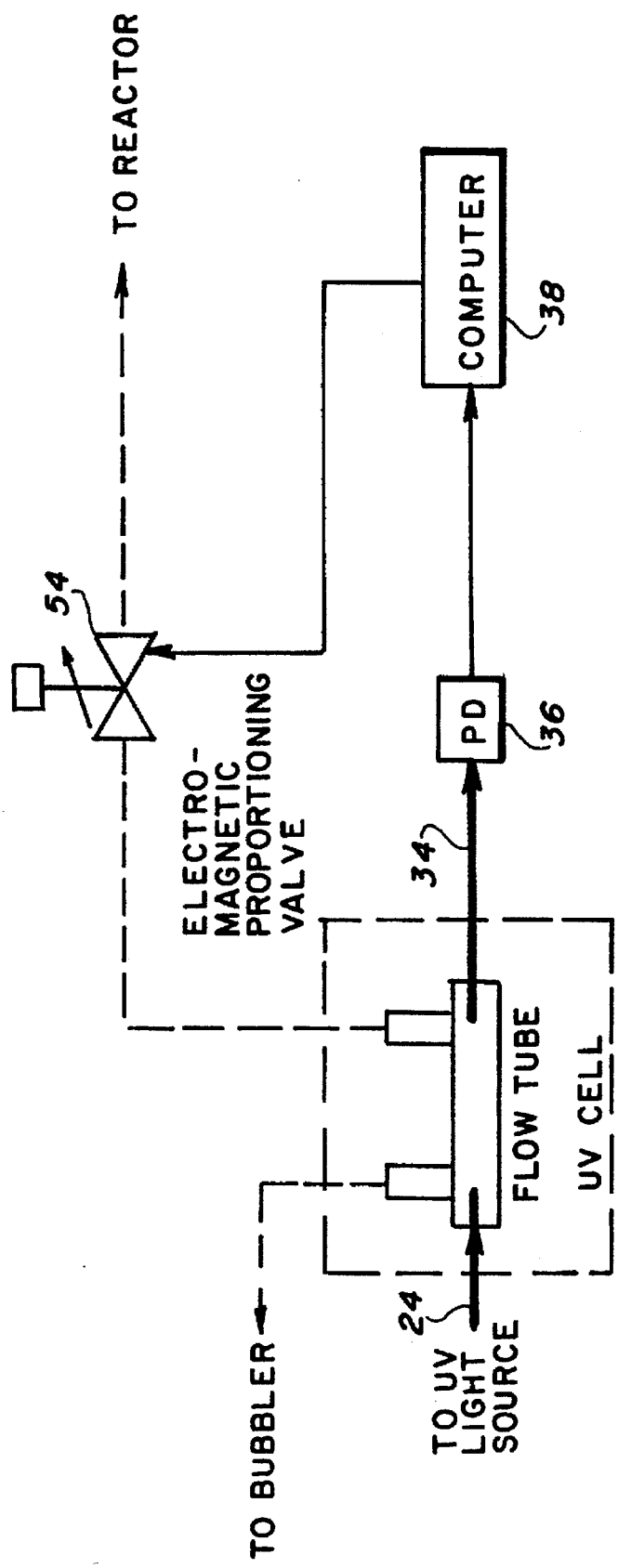
FIG. 4 shows the apparatus for the control of the bubbler effluent by an electromagnetic proportioning valve.
Figure 5:
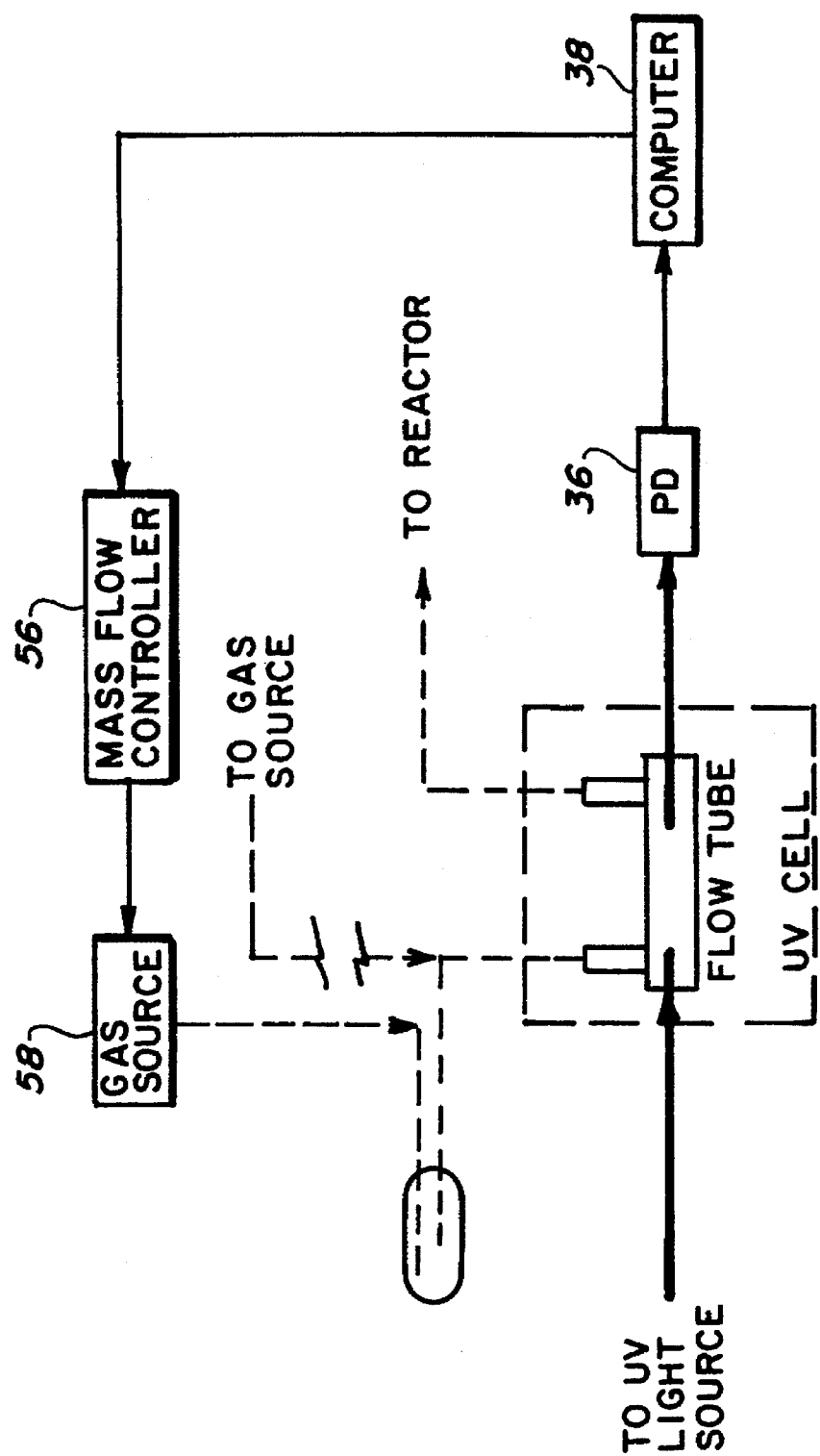
FIG. 5 shows apparatus for the control of the bubbler effluent delivered to the reactor by controlling the gas flow into the bubbler.
Figure 6:
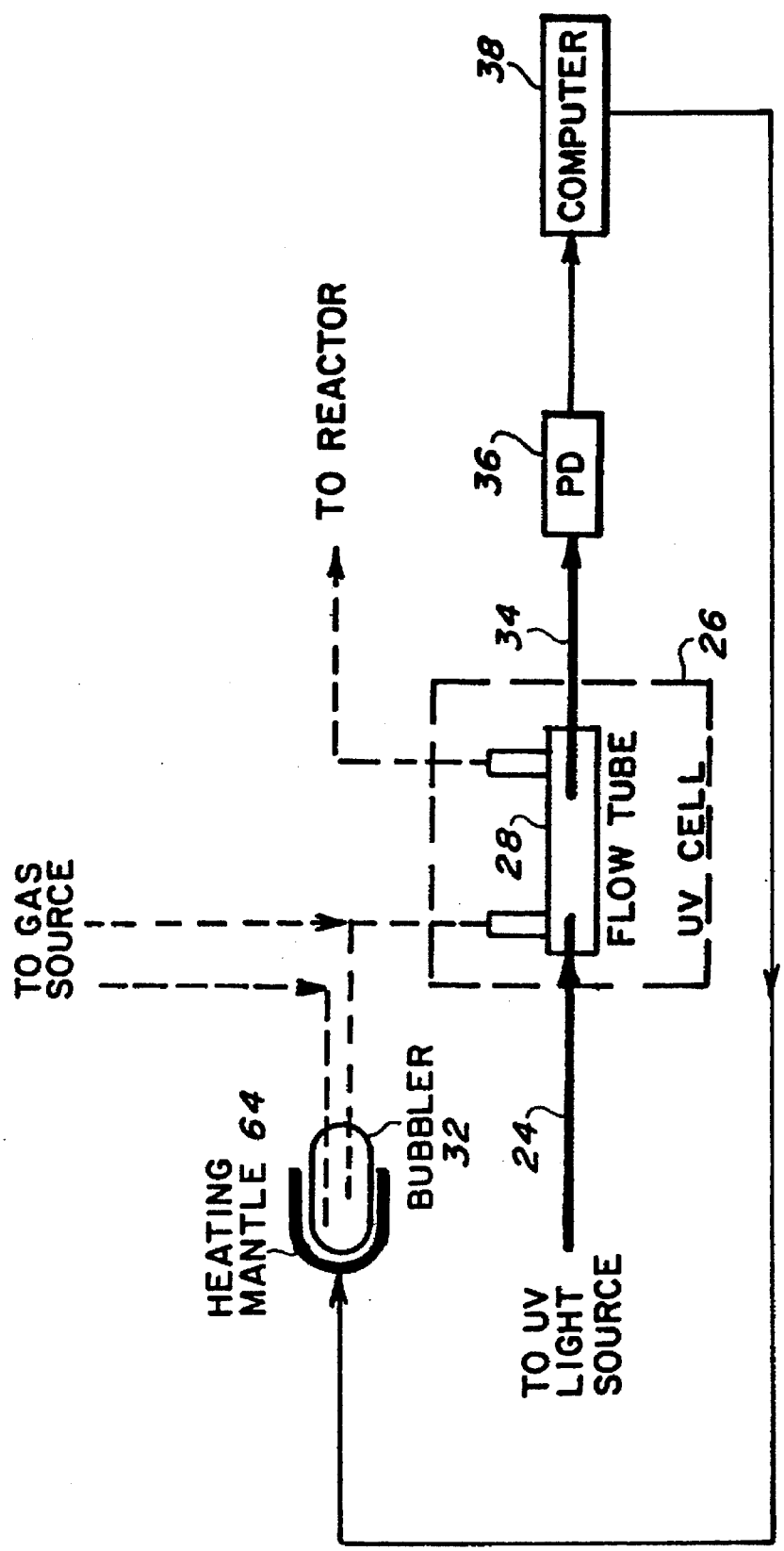
FIG. 6 shows the apparatus for control of the bubbler effluent concentration by controlling the bubbler temperature.

The concentration of metalorganic compound in the reactant gas may be controlled through a feedback of information from the computer 38 to the bubbler 32 in all of the foregoing embodiments. The computer 38, or controller, utilizing the absorption data can selectively control the bubbler temperature, bubbler pressure or the gas flow rate, thereby controlling the concentrations of gaseous species. FIG. 4 shows a preferred embodiment of a feedback control circuit for controlling the bubbler 32 effluent reactant concentration by the use of an electromagnetic proportioning valve 54. The valve 54 controls the upstream pressure of the gas and therefore the concentration of the metalorganic source. FIG. 5 shows another preferred embodiment of a feedback control circuit wherein the bubbler effluent delivered to the reactor (not shown) is controlled by carrier gas (i.e., argon) flowing into the bubbler 32. In this embodiment it is assumed that a reactant or saturated carrier gas leaving the bubbler 32 is normally limited to lower flow rates. The photodetector 36 output controls the mass flow controller 56 for the carrier gas from the gas source 58 through the computer 38. The general equation describing metalorganic mass flow is $$F = F_c(P_{sat})/(P - P_{sat})$$

where F is the metalorganic mass flow in standard cubic centimeters per minute(SCCM), $F_c$ is the carrier gas mass flow in sccm, $P_{sat}$ is saturated metalorganic vapor pressure, and P in the outlet pressure of the bubbler 32. Another preferred embodiment of a feedback control circuit is shown in FIG. 6. The bubbler effluent concentration is controlled by the bubbler 32 temperature. The output of the photodetector 36 is applied to a temperature controller 62 controlling the heating mantle 64 for the bubbler 32. The vapor pressure, $P_{sat}$, of the metalorganic source is defined by the Clausius-Clapeyron relationship which is well known to those skilled in the art. In all three feedback control embodiments, utilizing the absorption data, the computer 38 adjusts the parameters of the bubbler 32 or the gas flow parameters to increase or decrease the concentration of source material in the gas to achieve the desired stoichiometry in the reactor (not shown).

This invention provides a reliable method and apparatus for controlling film stoichiometry in mixed metal oxides using ultraviolet-visible spectrophotometry. The apparatus and method described herein allows for the detection of gas phase processes affecting concentration stability such as oligomer formation, ligand fission, or hydrolysis. The apparatus and method taught here may be used to grow any thin film by chemical vapor deposition. Also, this device can be used for purposes other than HTSC growth, some other uses are for ferroelectric cells, ferroelectric thin films, ferrite films, and ferrite pen cells, as well as a number of different oxides themselves. The techniques may be applied to any chemical species that have absorption bands in the UV-Vis spectrum.

Although the invention has been described in relation to exemplary embodiments thereof, it will be understood by those skilled in the art that still other variations and modifications can be affected in these preferred embodiments without detracting from the scope and spirit of the invention.

What is claimed is:

1. A device for the in-situ monitoring of metalorganic precursor delivery in a metalorganic chemical vapor deposition oxide system comprised of:

a source for generating a broadbeam ultraviolet-visible light beam;

means for generating one or more effluent metalorganic gas streams having a predetermined source concentration by passing a carrier gas over one or more metalorganic compounds heated to a predetermined temperature and at a predetermined pressure;

an optical fiber passing the broadband ultraviolet-visible light beam through the one or more effluent metalorganic gas streams;

means for monitoring a relative change in concentration of the ultraviolet-visible light beam passing through the one or more effluent metalorganic gas streams; and means for controlling the source concentration of the one or more effluent metal organic streams to provide stoichiometry control of the metalorganic precursor delivery for mixed oxide film deposition in the metalorganic chemical vapor deposition oxide system.

2. A device, as in claim 1, further comprised a means for selecting a one or more wavelengths of the ultraviolet-visible light beam equal to a predetermined absorbance band in the effluent metalorganic gas stream to be analyzed.

3. A device, as in claim 1, further comprised of a means for calibrating the means for monitoring the relative change in absorbance.

4. A device, as in claim 1, wherein the means for monitoring a relative change in ultraviolet-visible absorbance of the ultraviolet-visible light beam passing through one or more effluent metalorganic gas stream is comprised of a flow tube having receiving at least one effluent gas stream and interacting the ultraviolet-visible light beam with the effluent gas stream.

5. A device, as in claim 1, wherein the means for generating a effluent metalorganic gas stream is a bubbler.

6. A device, as in claim 1, wherein the means for monitoring a relative change in ultraviolet-visible absorbance of the ultraviolet-visible light beam passing through the effluent metalorganic gas stream is a spectrograph with a photodiode array.

7. A device, as in claim 1, wherein the means for monitoring a relative change in ultraviolet-visible concentration of the ultraviolet-visible light beam passing through one or more effluent metalorganic gas stream and means for controlling a source concentration in one or more effluent metal organic stream is a computer.

8. A device, as in claim 7, wherein the means for controlling a source concentration of the effluent metalorganic gas stream is further comprised of a electromagnetic proportioning valve controlling upstream pressure from the means for projecting the ultraviolet-visible light beam through one or more effluent metalorganic gas stream to control the concentration said gas.

9. A device, as in claim 7, wherein the means for controlling a source concentration of the effluent metal organic gas streams is further comprised of a means for controlling the carrier gas flowing into the means for generating one or more effluent metalorganic gas streams.

10. A device, as in claim 7, wherein the means for controlling a source concentration of the effluent metal organic gas stream is further comprised of a heating mantle surrounding the means for generating one or more effluent metalorganic gas stream to control the temperature of said metalorganic gas.

11. A device, as in claim 1, wherein the means for monitoring a relative change in concentration and the means for controlling a source concentration is a spectrograph and photodiode array.

12. A device for the in-situ monitoring of metalorganic precursor delivery in a metalorganic chemical vapor deposition oxide system comprised of:

a deuterium lamp producing a first ultraviolet-visible light beam;

a carrier gas applied to one or more bubblers at a predetermined pressure wherein the gas is passed over a metalorganic compound heated to a predetermined temperature to form an effluent metalorganic gas stream;

one or more ultraviolet-visible cells wherein the first ultraviolet-visible light is passed through the associated effluent metalorganic gas stream from the bubbler to produce a second broadbeam ultraviolet-visible light beam;

means for converting the second ultraviolet-visible light beam to an electrical signal;

a computer for determining the relative changes in concentration of the ultraviolet-visible light beam and comparing said changes with a predetermined absorbance level; and controlling the stoichiometry by feeding back data from the computer to a controlling parameter to stabilize fluctuations in source concentration in the effluent metalorganic gas stream so as to achieve the desired stoichiometry for mixed oxide film deposition in the metalorganic chemical vapor deposition oxide system.

13. A device, as in claim 12, further comprised of a means for selecting one or more wavelengths of the first or second ultraviolet-visible light beam equal to a predetermined concentration band in the metalorganic gas stream to be analyzed.

14. A device for the in-situ monitoring of metalorganic precursor delivery in a metalorganic chemical vapor deposition oxide system comprised of:

a deuterium lamp producing a first ultraviolet-visible light beam;

a carrier gas applied to one or more bubblers at a predetermined internal pressure wherein the gas is passed over a metalorganic compound heated to a predetermined temperature to form an effluent metalorganic gas stream;

one or more ultraviolet-visible cells wherein the first ultraviolet-visible light is passed through the associated effluent metalorganic gas stream from the bubbler to produce a second ultraviolet-visible light beam;

a narrow band filter to select one or more wavelengths of the first and second ultraviolet-visible light beam equal to a predetermined absorbance band in the metalorganic gas stream to be analyzed;

a photodetector converting the second ultraviolet-visible light beam to an electrical signal;

a computer for determining the relative changes in absorbance between the first and second ultraviolet-visible light beam and comparing said changes with a predetermined absorbance level; and controlling the stoichiometry by feeding back absorbance data from the computer to a controlling parameter to stabilize fluctuations in source concentration in the effluent metalorganic gas stream so as to achieve the desired stoichiometry control for mixed oxide film deposition in the metalorganic chemical vapor deposition oxide system.

15. A method for the in-situ monitoring of metalorganic precursor delivery in a metalorganic chemical vapor deposition oxide system comprised of:

generating an broadbeam ultraviolet-visible light beam;

generating one or more effluent metalorganic gas streams by passing a carrier gas over one or more metalorganic compounds heated to a predetermined temperature and under a predetermined pressure;

projecting the ultraviolet-visible light beam through the one or more effluent metalorganic gas streams;

monitoring a relative change in ultraviolet-visible absorbance of the ultraviolet-visible light beam passing through one or more effluent metalorganic gas streams; and controlling a source concentration of one or more effluent metal organic streams to provide stoichiometry control for mixed oxide film deposition in the metalorganic chemical vapor deposition oxide system.

* * * * *